(12) United States Patent
Lee

(10) Patent No.: US 11,960,906 B2
(45) Date of Patent: Apr. 16, 2024

(54) OUTPUT IMPEDANCE CALIBRATION, AND RELATED DEVICES, SYSTEMS, AND METHODS

(71) Applicant: Micron Technology, Inc., Boise, ID (US)

(72) Inventor: Hyunui Lee, Gyeonggi-do (KR)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/048,588

(22) Filed: Oct. 21, 2022

(65) Prior Publication Data

US 2023/0062002 A1 Mar. 2, 2023

Related U.S. Application Data

(63) Continuation of application No. 17/141,031, filed on Jan. 4, 2021, now Pat. No. 11,494,198.

(51) Int. Cl.
| | |
|---|---|
| G06F 9/445 | (2018.01) |
| G06F 3/06 | (2006.01) |
| G06F 13/20 | (2006.01) |
| G11C 7/10 | (2006.01) |
| G11C 11/4093 | (2006.01) |
| G06F 1/10 | (2006.01) |

(52) U.S. Cl.
CPC ........ G06F 9/44505 (2013.01); G06F 3/0604 (2013.01); G06F 3/0659 (2013.01); G06F 3/0673 (2013.01); G06F 13/20 (2013.01); G11C 7/1048 (2013.01); G11C 11/4093 (2013.01); G06F 1/10 (2013.01)

(58) Field of Classification Search
CPC .. G06F 9/44505; G06F 3/0604; G06F 3/0659; G06F 3/0673; G06F 13/20; G11C 7/1048; G11C 11/4093
See application file for complete search history.

(56) References Cited

U.S. PATENT DOCUMENTS

| | | | |
|---|---|---|---|
| 9,118,312 B2 * | 8/2015 | Jung | H03K 19/0005 |
| 9,935,632 B1 | 4/2018 | Gans | |
| 11,024,353 B1 | 6/2021 | Agrawal et al. | |
| 2013/0088257 A1 * | 4/2013 | Hara | G11C 29/028 326/30 |
| 2015/0340069 A1 | 11/2015 | Arai et al. | |

* cited by examiner

*Primary Examiner* — Tammara R Peyton
(74) *Attorney, Agent, or Firm* — TraskBritt

(57) ABSTRACT

A device may include a number of drivers, wherein each driver of the number of drivers includes a number of transistors coupled to an output node. The device may further include circuitry coupled to the number of drivers. The circuitry may configure at least one driver of the number of drivers in each of a number of configurations, wherein each configuration of the number of configurations is associated with a calibration code of a number of calibration codes. Each configuration generates, in response to signal transmission via the output node, an associated channel performance response of a number of channel performance responses. The circuitry may also store a calibration code for the at least one unit driver, wherein the calibration code generates a desired channel performance response of the number of channel performance responses. Systems and related methods of operation are also described.

19 Claims, 9 Drawing Sheets

OUTPUT IMPEDANCE CALIBRATION, AND RELATED DEVICES, SYSTEMS, AND METHODS

CROSS-REFERENCE TO RELATED APPLICATION

This application is a continuation of U.S. patent application Ser. No. 17/141,031, filed Jan. 4, 2021, now U.S. Pat. No. 11,494,198, issued Nov. 8, 2022, the disclosure of which is hereby incorporated herein in its entirety by this reference.

TECHNICAL FIELD

Embodiments of the disclosure relate to impedance calibration. Yet more specifically, some embodiments of the disclosure relate to output impedance calibration of microelectronic devices, and related methods, devices, and systems.

BACKGROUND

Memory devices are typically provided as internal, semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data rate memory (DDR), low-power double-data rate memory (LPDDR), phase change memory (PCM), and Flash memory.

Electronic systems, such as memory systems, often include one or more types of memory, and that memory is typically coupled to one or more communications channels within a memory system. Time varying signals in such systems are utilized to transfer information (e.g., data) via one or more conductors often referred to as signal lines. These signal lines are often bundled together to form a communications bus, such as an address or data bus.

To meet demands for higher performance operating characteristics, designers continue to strive for increasing operating speeds to transfer data across communications buses within electronic systems. One issue with increased data transfer rates is maintaining signal integrity during bursts of data on communication buses of electronic (e.g., memory) systems. As transfer rates increase, impedance characteristics of a communication bus may become more pronounced, and signal waveforms may begin to spread out and/or reflections may occur at locations of unmatched impedance on the communication bus. Signal integrity (e.g., data integrity) may be affected when an impedance (e.g., output impedance) of one or more nodes of a memory device coupled to a communication bus is not properly matched to an impedance of the communications bus.

DETAILED DESCRIPTION

A memory device (e.g., of a memory system) may include an output device including one or more output drivers for driving signals (e.g., off-chip) during data transmission. As will be appreciated, various memory systems, including, for example, two dual in-line memory modules (DIMMs) per channel (2DPC) memory systems and four DIMMs per channel (4DPC) memory systems, may include variable internal characteristics and may exhibit variable channel performance responses (e.g., during data transmission). Channel performance may impact signal integrity, and although a memory system may comply with a design specification, signal integrity of a memory system may be less than ideal (e.g., due to less-than-ideal channel performance). In some conventional devices, systems, and methods, signal integrity issues are addressed via manual adjustment of output driver circuitry (e.g., manual adjustment of ON resistance (Ron) of an output driver). However, manual adjustment of output driver circuitry requires additional resources and time and may result in other issues (e.g., design fragments due to variable characteristics).

As disclosed herein, various embodiments may relate to automated impedance calibration (e.g., performed via an automated training operation) (e.g., for semiconductor device read operations). Various embodiments of the disclosure may enhance, and possibly optimize, signal integrity associated with semiconductor devices (e.g., memory devices and/or memory systems). For example, in some embodiments, signal integrity of a semiconductor device may be enhanced, and possibly optimized, without manual adjustment (e.g., without requiring adjustment via a designer and/or a user) of an output impedance. Further, according to some embodiments, undesirable design fragments may be avoided (e.g., via automated impedance calibration, as described herein). As will be appreciated, various embodiments disclosed herein may be used in place of (i.e., may replace) traditional calibration operations.

Although various embodiments are described herein with reference to memory systems and/or memory devices, the present disclosure is not so limited, and the embodiments may be generally applicable to microelectronic systems and/or devices that may or may not include semiconductor devices and/or memory devices. Embodiments of the present disclosure will now be explained with reference to the accompanying drawings.

Figure 1:
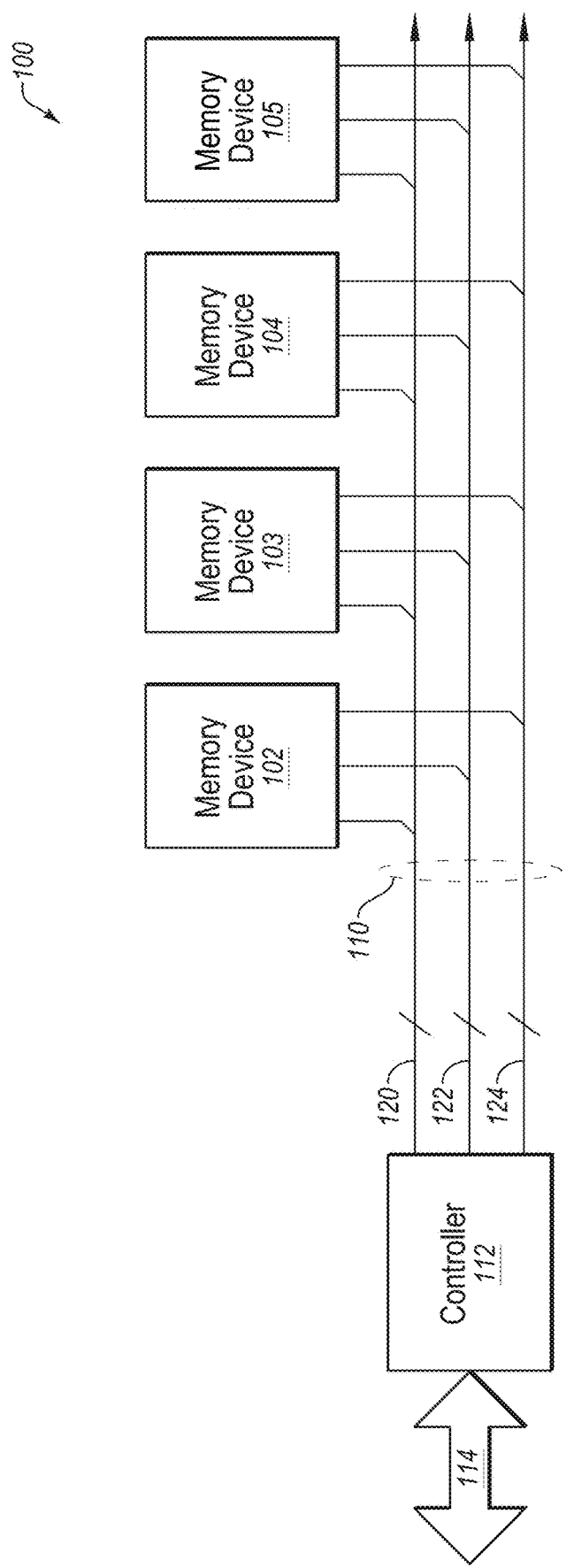
FIG. 1 is a block diagram of an example memory system including a number of memory devices, in accordance with various embodiments of the present disclosure.

FIG. 1 illustrates an example memory system 100, according to various embodiments of the present disclosure. Memory system 100 includes a number of memory devices 102-105 coupled to a communications bus 110 (e.g., a system bus). Each memory device 102-105 may include one or more memory die, and collectively, memory devices 102-105 may be referred to as a dual in-line memory module (DIMM), a multi-chip package (MCP), or a package on package (POP). Each memory device 102-105 of memory system 100 may include an output driver including a number of unit drivers and associated calibration circuitry, as described more fully below.

Memory system 100 further includes a controller 112 coupled to each memory device 102-105 via communication bus 110. Controller (also referred to herein as a "host") 112, which may include a processor or any other type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB).

Figure 2:
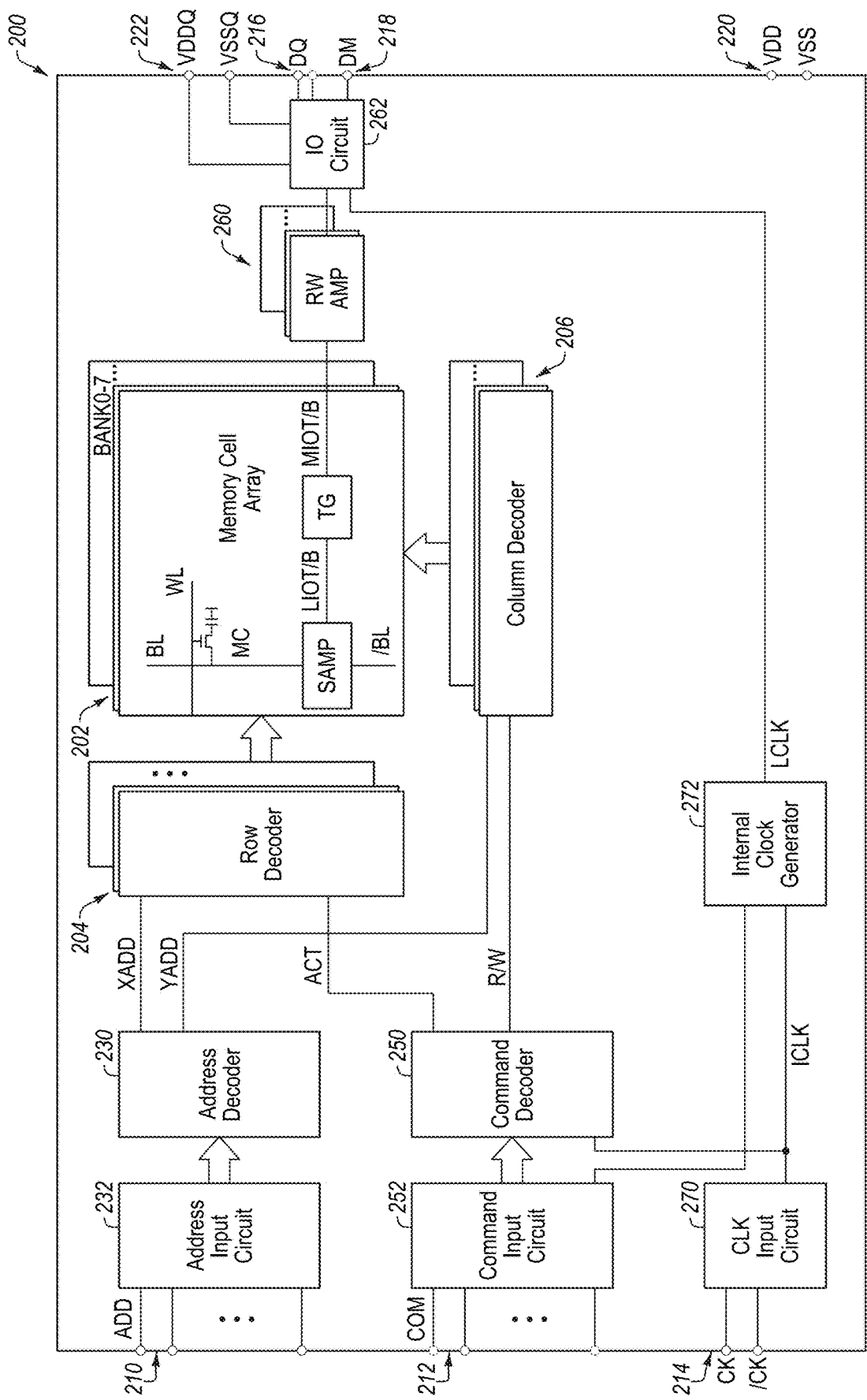
FIG. 2 is a functional block diagram of an example memory device, according to various embodiments of the present disclosure.

FIG. 2 is a functional block diagram illustrating an example memory device 200, in accordance with at least one embodiment of the present disclosure. Memory device 200 may include, for example, a DRAM (dynamic random-access memory), a SRAM (static random-access memory), a SDRAM (synchronous dynamic random-access memory), a DDR SDRAM (double-data rate SDRAM, such as a DDR4 SDRAM and the like), or a SGRAM (synchronous graphics random-access memory). For example, one or more of memory devices 102-105 of FIG. 1 may include memory device 200. Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 204 and the selection of the bit lines BL and/BL may be performed by a column decoder 206. In the embodiment of FIG. 2, row decoder 204 may include a respective row decoder for each memory bank BANK0-7, and column decoder 206 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 260 over complementary local data lines (LIOT/B), a transfer gate (TG), and complementary main data lines (MIOT/B). Conversely, write data outputted from read/write amplifiers 260 may be transferred to sense amplifier SAMP over complementary main data lines MIOT/B, transfer gate TG, and complementary local data lines LIOT/B, and written in memory cell MC coupled to bit line BL or/BL.

Memory device 200 may be generally configured to be receive various inputs (e.g., from an external controller) via various terminals, such as address terminals 210, command terminals 212, clock terminals 214, data terminals 216, and data mask terminals 218. Memory device 200 may include additional terminals such as a power supply terminal 220 and a power supply terminal 222.

During a contemplated operation, one or more command signals COM, received via command terminals 212, may be conveyed to a command decoder 250 via a command input circuit 252. Command decoder 250 may include a circuit configured to generate various internal commands via decoding the one or more command signals COM. Examples of the internal commands include an active command ACT and a read/write signal R/W.

Further, one or more address signals ADD, received via address terminals 210, may be conveyed to an address decoder 230 via an address input circuit 232. Address decoder 230 may be configured to supply a row address XADD to row decoder 204 and a column address YADD to column decoder 206. Although command input circuit 252 and address input circuit 232 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to the read/write signal R/W, column decoder 206 may be activated, and the bit line BL specified by the column address YADD may be selected.

In response to active command ACT, a read signal, a row address XADD, and a column address YADD, data may be read from the memory cell MC specified by the row address XADD and the column address YADD. The read data may be output via sense amplifier SAMP, transfer gate TG, read/write amplifiers 260, an input/output circuit 262, and data terminals 216. Further, in response to active command ACT, a write signal, a row address XADD, and a column address YADD, write data may be supplied to memory array 202 via data terminals 216, input/output circuit 262, read/write amplifiers 260, transfer gate TG, and sense amplifier SAMP. The write data may be written to the memory cell MC specified by the row address XADD and the column address YADD.

Clock signals CK and/CK may be received via clock terminals 214. A clock input circuit 270 may generate internal clock signals ICLK based on the clock signals CK and/CK. Internal clock signals ICLK may be conveyed to various components of memory device 200, such as command decoder 250 and an internal clock generator 272. Internal clock generator 272 may generate internal clock signals LCLK, which may be conveyed to input/output circuit 262 (e.g., for controlling the operation timing of input/output circuit 262). Further, data mask terminals 218 may receive one or more data mask signals DM. When data mask signal DM is activated, overwrite of corresponding data may be prohibited.

According to various embodiments, input/output circuit 262 may include one or more output drivers, wherein, as described in more detail below, each output driver may include one or more unit drivers and associated circuitry for calibrating (also referred to herein as "training") the one or more unit drivers. More specifically, as described in more detail below, a desired output impedance (e.g., for read operations) of the one or more unit drivers of input/output circuit 262 may be determined (i.e., via a calibration/training operation) such that an associated memory device may exhibit acceptable (e.g., desired and/or optimal) signal integrity during device operation.

Figure 3:
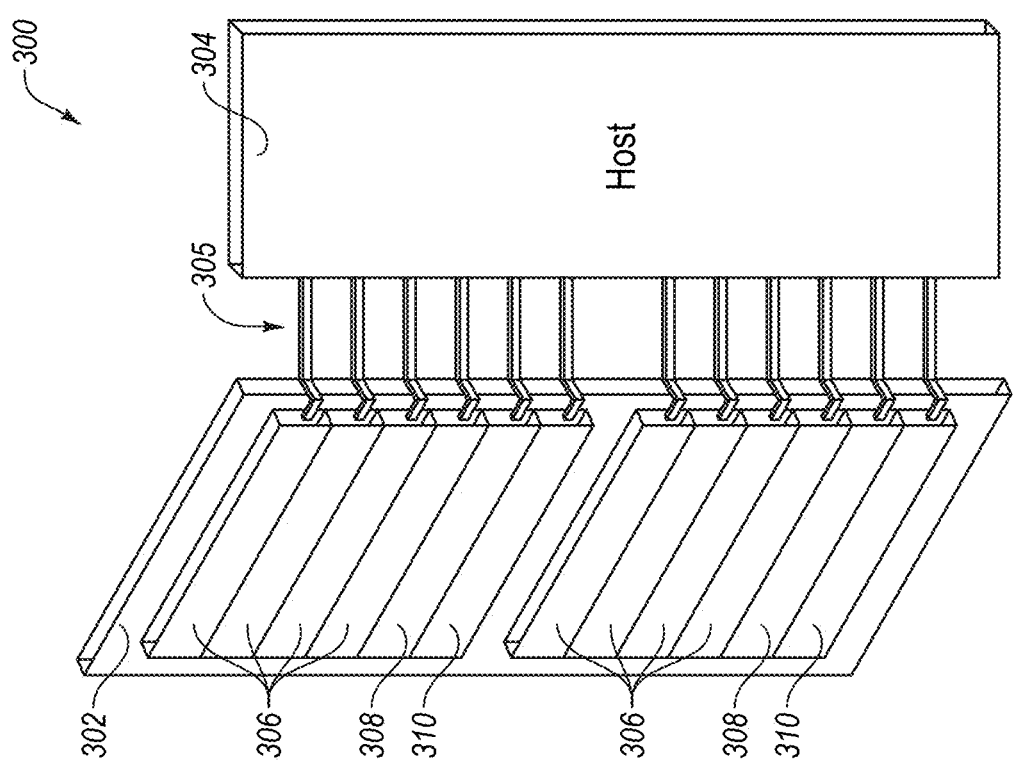
FIG. 3 depicts an example memory system including a dual in-line memory module coupled to a host, in accordance with various embodiments of the present disclosure.

FIG. 3 depicts a memory system 300 including a dual in-line memory module (DIMM) 302 coupled to a host 304, according to various embodiments of the present disclosure. DIMM 302 includes a number of memory components (e.g., memory devices) 306 for conveying data from the memory device to host (also referred to herein as a "controller") 304 via one or more channels 305.

As will be appreciated, each memory component 306 may include a number of (e.g., 4, 8, or 16) DQ components (e.g., DQ pads and/or DQ pins) (not shown in FIG. 3). DIMM 302 further includes data strobe components 308 and 310 for conveying strobe clock signals from DIMM 302 to host 304. As will be appreciated, in some examples, signal integrity (e.g., for data transmission via one or more channels 305) may vary across memory components 306 of memory system 300. Further, in some examples, signal integrity (e.g., for data transmission via one or more channels 305) may vary across DQ components of a single memory component 306.

Figure 4A:
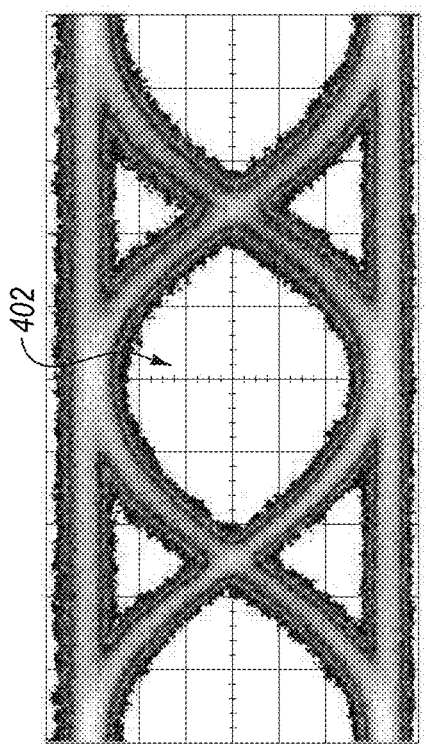
FIGS. 4A and 4B each depict an example channel performance response of a memory system.
Figure 4B:
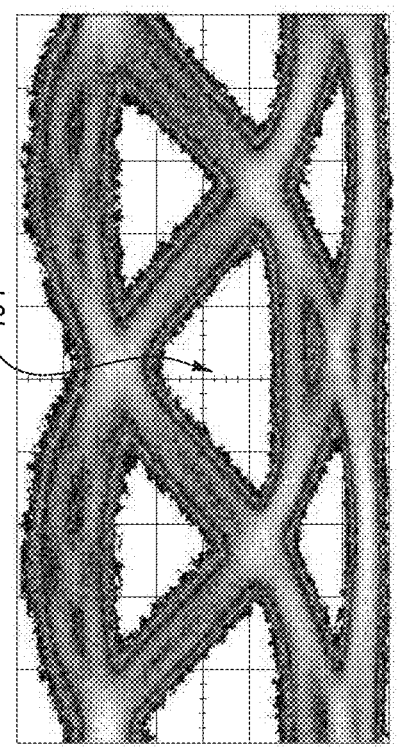

FIGS. 4A and 4B each depict an example channel performance response of a memory system. More specifically, FIGS. 4A and 4B each depict a signal integrity result (also referred to herein as "signal integrity," "signal integrity response," "channel performance," "channel performance response") for a channel (e.g., channel 305 of FIG. 3) of a memory system (e.g., memory system 300 of FIG. 3). As will be appreciated, a data eye 402 of FIG. 4A is larger compared to a data eye 404 of FIG. 4B, and thus, the signal integrity result depicted in FIG. 4A is improved relative to the signal integrity result depicted in FIG. 4B.

Figure 5:
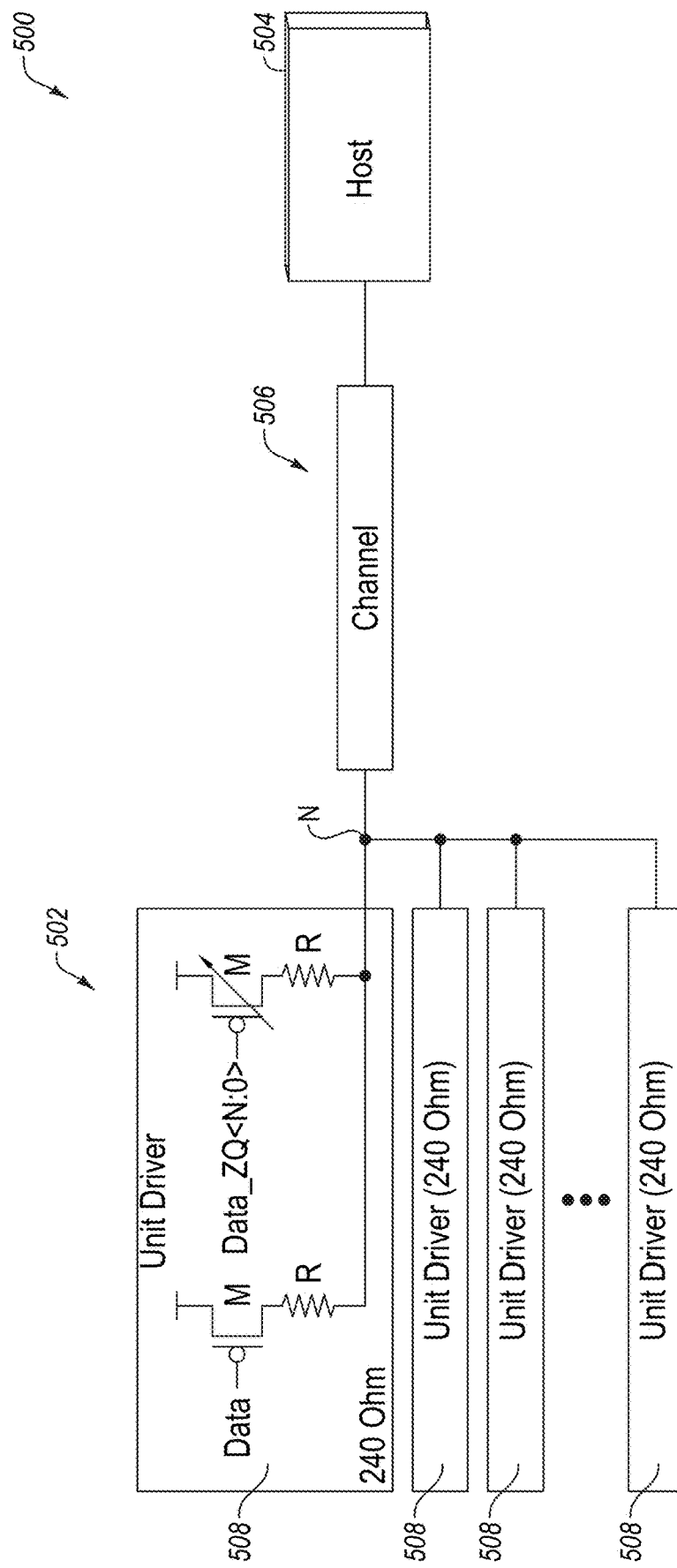
FIG. 5 depicts an example memory system including an output driver of a memory device coupled to a host.

FIG. 5 depicts a memory system 500 including an output driver 502 (e.g., of a memory device (e.g., a DRAM)) coupled to a host 504 via a channel 506. Output driver 502 includes a number of drivers 508 coupled in parallel. Each driver (also referred to herein as "unit driver") 508 may have the same or similar circuit structures. More specifically, each driver 508 includes a number of transistors M. Further, each driver 508 includes a resistor R coupled between a terminal (e.g., a source or a drain) of an associated transistor M and a node N (also referred to herein as an "output node," a "DQ node," a "DQ pin," or a "DQ pad"). As will be appreciated, a number of operation signals may be supplied to the gates of transistors M to select a number of transistors. In other words, each transistor M may be individually controlled (i.e., turned on/off) based on an associated operation signal. In this example, each driver 508 has an output impedance of 240 ohms.

As will appreciated, signal integrity (i.e., for a memory device read operation) may be affected by an output resistance Ron (also referred to as "on resistance") of an output driver and possibly system characteristics (e.g., channel characteristics) associated with the output driver. As will also be appreciated, in some systems, a value for output resistance Ron may be 240 Ohms, which may be adjusted via output impedance (ZQ) calibration. Although a value for output resistance Ron may be adjusted (e.g., according to a design specification), signal integrity may be less than ideal (e.g., due to less-than-ideal channel performance). Thus, according to at least some embodiments, a value for output resistance Ron may be adjusted (e.g., from a specification value) (e.g., to improve signal integrity). More specifically, according to at least some embodiments, a value for output resistance Ron may be adjusted via an automated calibration process (e.g., without requiring manual adjustment).

In some cases, signal integrity may be enhanced (e.g., optimized) with a Ron value that is out of a specification range. For example, a Ron value of 220 Ohms may provide optimal results even if a design specification includes a Ron value of 240 Ohms and an allowable variation of 5% (i.e., 228-252 Ohms). As noted above, conventional systems, devices, and methods may tune output resistance Ron via a manual process, which requires additional resources and/or time.

Figure 6:
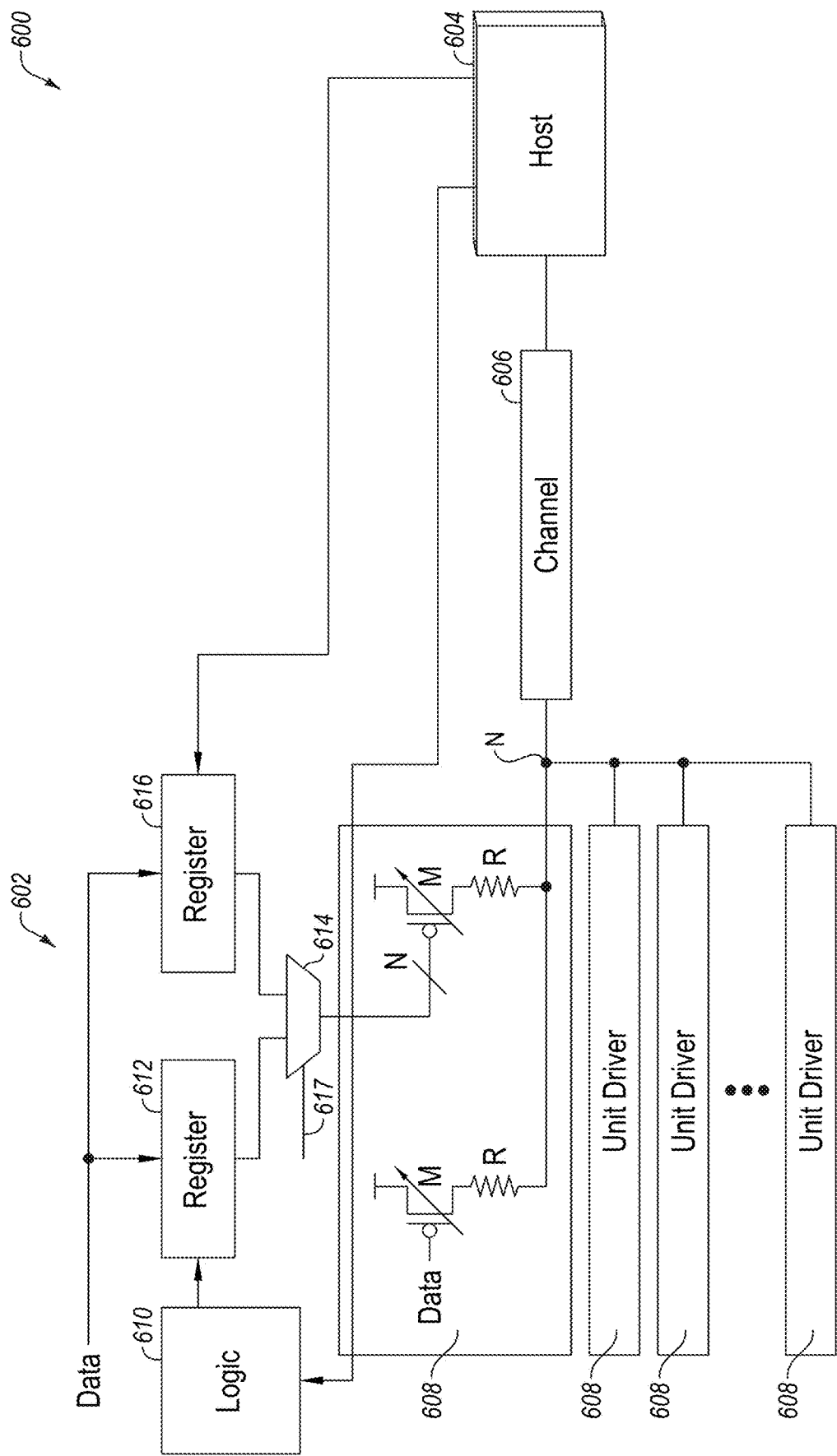
FIG. 6 depicts an example memory system including an output driver of a memory device coupled to a host, according to various embodiments of the present disclosure.

FIG. 6 depicts an example memory system 600, according to various embodiments of the present disclosure. Memory system 600 includes an output driver 602 (e.g., of a memory device (e.g., memory device 200 of FIG. 2)) coupled to a host 604 via a channel 606. For example, with reference to FIGS. 3 and 6, output driver 602 may part of memory component 306, channel 606 may include channel 305, and host 604 may include host 304.

With reference to FIG. 6, output driver 602 includes a number of drivers 608, wherein each driver (also referred to herein as "unit driver") 608 includes a number of transistors M. Similar to memory system 500 of FIG. 5, each transistor M of memory system 600 may be individually controlled (i.e., turned on/off) based on an associated operation signal. Each driver 608 may include a resistor R coupled between a terminal (e.g., a source or a drain) of an associated transistor M and node N, which may include an output node (e.g., a DQ node). As will be appreciated, in some embodiments (e.g., wherein output resistance Ron is relatively small), resistors R may not be necessary.

Output driver 602 further includes logic 610 (also referred to herein as "ZQ calibration logic" or "calibration logic"), a register 612, a multiplexer 614, and a register 616. Multiplexer 614 may be configured to receive a control signal 617 (e.g., for conveying either an output of register 612 during a calibration process or an output of register 616 during device operation). According to some embodiments, each unit driver 608 may include dedicated calibration circuitry (e.g., logic 610, registers 612 and 614, and multiplexer 614). In other embodiments, more than one unit driver 608 may be supported by the same calibration circuitry (e.g., logic 610, registers 612 and 614, and multiplexer 614).

As illustrated in FIG. 6, host 604 is coupled to output driver 602 via channel 606 (e.g., for receiving various signals). Further, according to some embodiments, host 604 may be coupled to logic 610 and/or register 616 of output driver 602.

According to various embodiments, memory system 600 may be configured to determine, via testing, a value of output resistance Ron that enhances, and possibly optimizes, the signal integrity associated with channel 606. Further, the determined Ron value may be used during operation of memory system 600. More specifically, for example, memory system 600 may be configured to test a number of values for output resistance Ron (e.g., based on a number of calibration codes) to determine an optimal value for Ron of the number Ron values. Further, a calibration code associated with the determined Ron value may be stored in register 616 and used during operation of memory system 600.

A more detailed example calibration operation (also referred to herein as a "training operation") of memory system 600 will now be described. In this example, host 604 may convey a signal to driver 608 for configuration thereof.

More specifically, in some embodiments, host 604 may convey a calibration code to logic 610, which may provide the calibration code to register 612. Further, in these embodiments, the calibration code may be provided, via multiplexer 614, to output driver 608 for selecting a number of transistors M (e.g., 1-N transistors are selected to be turned ON (i.e., to conduct)). In other embodiments, logic 610, register 612, and/or multiplexer 614 may not be necessary (i.e., for providing a calibration code to driver 608), and, in these embodiments, host 604 may convey the calibration code to output driver 608 for selecting the number of transistors M.

It is noted that each calibration code may be associated with and/or be indicative of a driver configuration. For example, a calibration code of "one" may be associated with and/or be indicative of a driver configuration wherein "one" transistor of driver 608 is selected (i.e., to conduct). As another example, a calibration code of "five" may be associated with and/or be indicative of a driver configuration wherein "five" transistors of driver 608 are selected (i.e., to conduct).

Continuing with this example operation, with the selected number of transistors conducting, a signal may be transmitted from output driver 602 to host 604 (i.e., data may be read from output driver 602), and a channel performance response may be measured and/or evaluated. For example, a size of a data eye of the channel performance response may be measured and/or evaluated. Moreover, the channel performance response may be compared to a previous channel performance response. If the channel performance response is improved compared to a previous channel performance response (i.e., a previous channel performance response associated with a calibration code stored in register 616), or if the channel performance response is the first channel performance response in the calibration operation (i.e., register 616 does not include a stored calibration code), the associated calibration code may be stored in register 616. For example, in response to determining that a channel performance response is improved relative to a previous channel performance response, host 604 may convey a signal to output driver 602 to instruct output driver 602 to store an associated calibration code in register 616.

On the other hand, if the channel performance response is not improved compared to a previous channel performance response (i.e., a previous channel performance response associated with a calibration code stored in register 616), the associated calibration code may not be stored in register 616. This calibration ("training") process may be repeated for each of a number of calibration codes such that a channel performance response for each of a number of transistor configurations (e.g., one transistor is conducting, two transistors are conducting, three transistors are conducting, and so on) of driver 608 is generated and measured and/or evaluated, and a calibration code associated with a desired (e.g., optimal) channel performance response is stored in register 616.

As will be appreciated, in some contemplated operations, a calibration code associated with a first test configuration (e.g. one transistor conducting) may be stored in register 616 (i.e., regardless of the channel performance response). In other words, because a channel performance response of the first test configuration may not be compared to a channel performance response of another configuration, by default, the calibration code associated with the first test configuration is stored in register 616. As noted above, host 604 may convey a signal to output driver 602 to instruct output driver 602 to store, in register 616, a calibration code associated with the first test configuration. Thereafter, in this example, host 604 may convey a signal (e.g., a calibration code) to driver 608 for configuring driver 608 in a second test configuration. Further, a signal may be transmitted from output driver 602 (i.e., data is read out from output driver 602), and a channel performance response of the second test configuration (e.g. two transistors conducting) may be compared to the channel performance response of the first test configuration.

If the channel performance response of the second test configuration is improved relative to the channel performance response of the first test configuration, a calibration code associated with the second test configuration may be stored in register 616 (i.e., the calibration code associated with the second test configuration overwrites the calibration code associated with the first test configuration). For example, in response to determining that the channel performance response of the second test configuration is improved relative to the channel performance response of the first test configuration, host 604 may convey a signal to output driver 602 to instruct output driver 602 to store, in register 616, the calibration code associated with the second test configuration. Further, in this example, host 604 may convey a signal (e.g., a calibration code) to driver 608 for configuring driver 608 in a third test configuration. Moreover, a signal may be transmitted from output driver 602 to host 604, and a channel performance response of a third test configuration (e.g. three transistors conducting) may be compared to the channel performance response of the second test configuration.

On the other hand, if the channel performance response of the second test configuration is not improved relative to the channel performance response of the first test configuration, a calibration code associated with the second test configuration may not be stored in register 616 (i.e., the calibration code associated with the first tested configuration remains stored in register 616). It is noted that, according to some embodiments, it may not be required for host to send feedback to output driver 602 if the channel performance response of the second test configuration is not improved relative to the channel performance response of the first test configuration. Further, continuing with this example, host 604 may convey a signal (e.g., a calibration code) to driver 608 for configuring driver 608 in a third test configuration. Thereafter, in this example, a channel performance response of a third test configuration (e.g. three transistors conducting) may be compared to the channel performance response of the first test configuration.

As will be appreciated, after testing each of a number of (e.g., N) test configurations, a calibration code associated with a test configuration that generated the best channel performance response of a number of (e.g., N) channel performance responses may be stored in register 616. Further, during operation (i.e., during operation of output driver 602), register 616 may convey the calibration code (i.e., via multiplexer 614) to unit driver 608 for configuring unit driver 608 in the configuration that generated the best channel performance response (i.e., during the calibration/training process).

Figure 7:
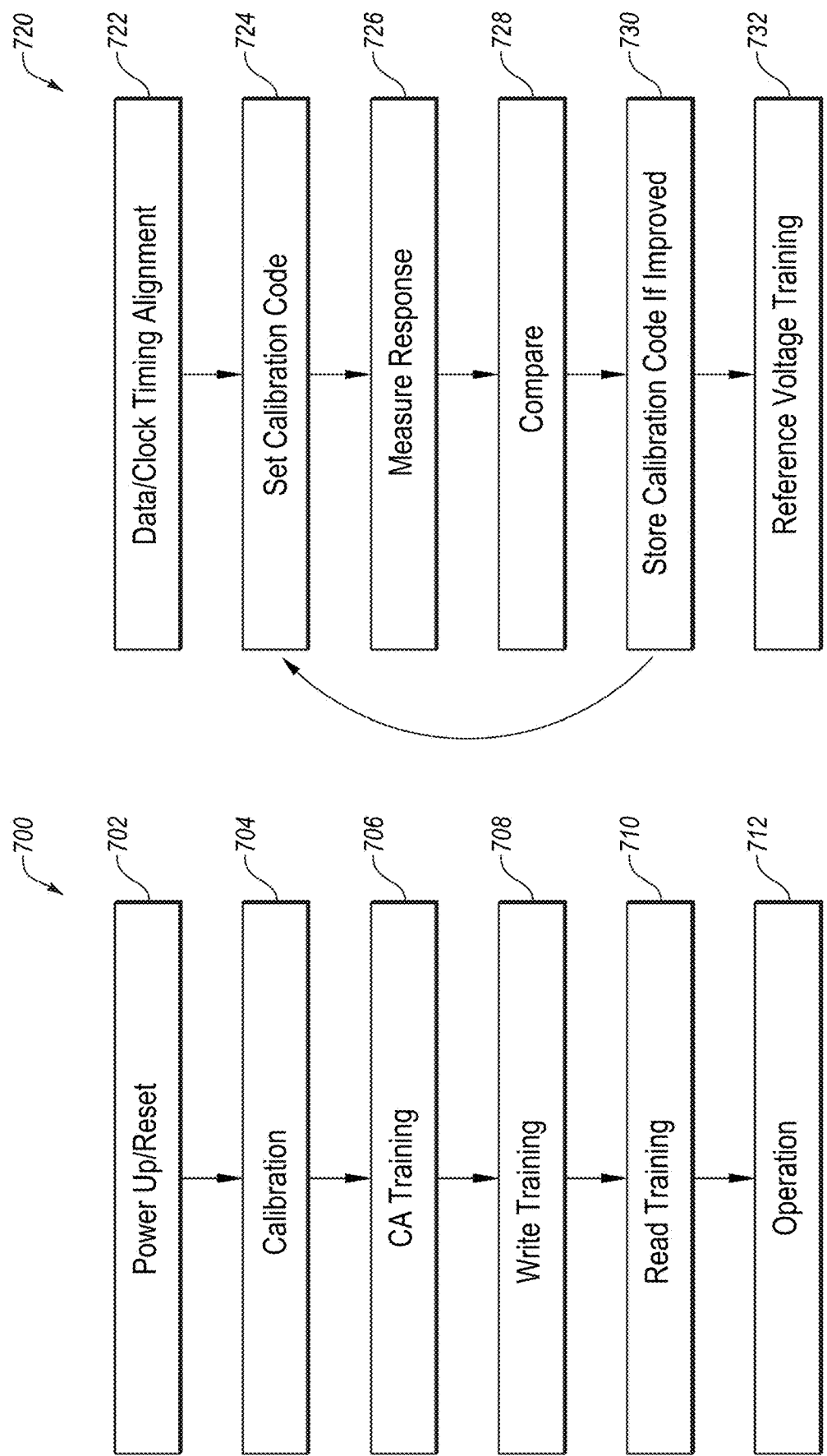
FIG. 7A is a flowchart illustrating an example method of operating a memory system, in accordance with various embodiments of the present disclosure.
FIG. 7B is a flowchart illustrating an example method of performing read training of a memory device, in accordance with various embodiments of the present disclosure.

FIG. 7A is a flowchart of an example method 700 of operating a memory system. More specifically, method 700 may be used for initializing and/or calibrating a memory system. Method 700 may be arranged in accordance with at least one embodiment described in the present disclosure. Method 700 may be performed, in some embodiments, by a device or system, such as memory system 100 of FIG. 1, one or more memory devices of memory system 100, memory device 200 of FIG. 2, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

Method 700 may begin at block 702, wherein a memory system (e.g., memory system 600 of FIG. 6) may be powered up or reset, and method 700 may proceed to block 704. At blocks 704, 706, and 708, various calibration and/or training operations for the memory system may be performed. More specifically, for example, as will be appreciated by a person having ordinary skill in the art, at block 704, ZQ calibration may be performed, at block 706, command-and-address (CA) training may be performed, and at block 708, write training may be performed.

Further, at block 710, read training, in accordance with various embodiments of the present disclosure, may be performed. With reference to a flowchart depicted in FIG. 7B, an example method 720 of performing read training of a memory device will now be described. Method 720 may be arranged in accordance with at least one embodiment described in the present disclosure. Method 720 may be performed, in some embodiments, by a device or system, such as memory system 100 of FIG. 1, one or more memory devices of memory system 100, memory device 200 of FIG. 2, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

At block 722, one or more data and/or clock timing alignment operations may be performed, as will be appreciated, and method 720 may proceed to block 724. At block 724, a calibration code, which is used to configure a unit driver, may be set, and method 720 may proceed to block 726. More specifically, for example, in response to receipt of a calibration code (e.g., from host 604), a number of transistors (e.g., 1, 2, 3, etc.) of a unit driver (e.g., unit driver 608 of FIG. 6) may be turned ON (i.e., to adjust output resistance Ron).

At block 726, in response to a signal being conveyed from output driver 602 to host 604 (e.g., data being read out via output driver 602), a channel performance response (i.e., for the calibration code and associated configuration) may be measured (e.g., via host 604 of FIG. 6). For example, a size (e.g., a height and/or width) of an eye of the channel performance response may be measured. Further, at block 728, the channel performance response may be compared to a previous "best" channel performance response (i.e., if a previous "best" response exists). For example, the height of an eye of the channel performance response may be compared to a height of an eye of the previous "best" channel performance response. Further, if the channel performance response is better than the previous "best" channel performance response (or if a previous channel performance response has not occurred), the calibration code may be stored (i.e., at the associated memory device (e.g., in register 616 of FIG. 6)) at block 730.

As will be appreciated, blocks 724-730 may be repeated for each calibration code of a number of calibration codes. More specifically, a number of driver configurations (e.g., including 1-N conducting transistors) may be tested for a number of (e.g., N) of calibration codes. After each possible calibration code is tested, and a calibration code associated with a desired (e.g., an optimal) channel performance response is stored (e.g. in register 616 of FIG. 6), method 720 may proceed to block 732, wherein one or more reference voltage training operations may be performed.

With reference again to FIG. 7A, upon completion of the read training operations at block 710, method 700 may proceed to block 712, wherein the memory system may operate (e.g., perform various operations, such as, for example, read, write, refresh, etc.).

As noted above, signal integrity may vary across memory components (e.g., memory devices) of memory system. Thus, according to some embodiments, one or more memory devices of a memory system (e.g., memory device of a DIMM) may be calibrated according to various embodiments disclosed herein. More specifically, for example, one or more of memory devices 102-105 (see FIG. 1) may be calibrated (i.e., individually) (e.g., via different calibration processes) according to various embodiments disclosed herein. As another example, one or more of memory components 306 of memory system 300 (see FIG. 3) may be calibrated (i.e., individually) according to various embodiments disclosed herein. In these examples, each memory component may or may not utilize the same calibration code (i.e., during operation). In other examples, a number of memory components (e.g., of a memory system) may be calibrated together (i.e., via a single calibration process). In this example, each memory component may utilize the same calibration code (i.e., during operation).

As also noted above, signal integrity may vary across components (e.g., DQ components and/or unit drivers) of a single memory device. Thus, according to various embodiments, one or more unit drivers of one or more output drivers of a memory device may be calibrated (i.e., individually) (e.g., via different calibration processes) according to various embodiments disclosed herein. Moreover, for example, one or more DQ components of a memory device may be calibrated (i.e., individually) according to various embodiments disclosed herein. For example, one or more of unit drivers 608 (see FIG. 6) may be calibrated (i.e., individually) according to various embodiments disclosed herein. In these examples, each component (e.g., each unit driver and/or DQ component) may or may not utilize the same calibration code (i.e., during operation). In other examples, a number of unit drivers and/or DQ components (e.g., of a memory device) may be calibrated together (i.e., via a single calibration process). In this example, each component may utilize the same calibration code (i.e., during operation).

Figure 8:
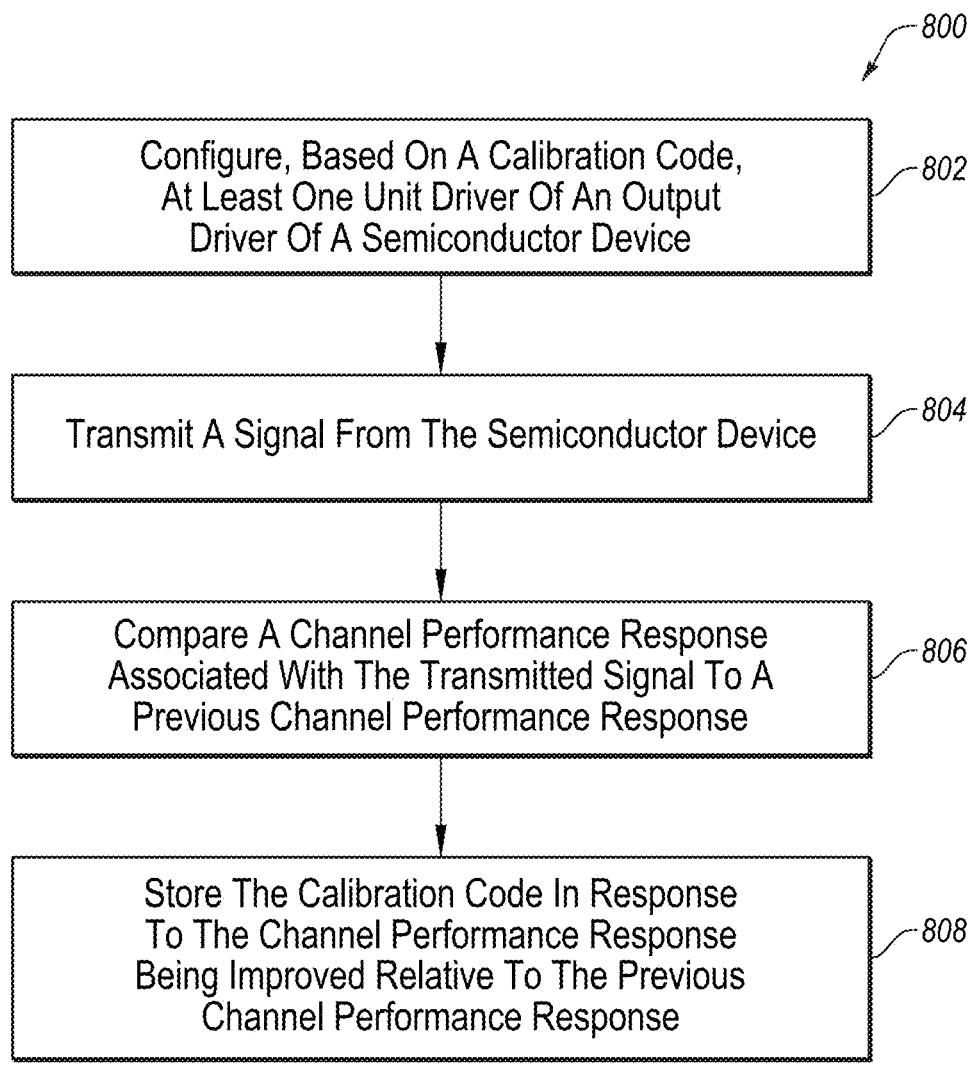
FIG. 8 is a flowchart illustrating an example method of calibrating a memory device, according to various embodiments of the present disclosure.

As will be appreciated, an on-die termination (ODT) value may be determined by output resistance Ron. Thus, various embodiments disclosed herein may be used to determine (e.g., via training/testing) an ODT value to enhance, and possibly optimize, signal integrity. In at least some embodiments, an additional register may be used for ODT training/testing. Further, in at least some embodiments, additional ODT may be performed after read training (e.g., after operations at block 710 of FIG. 7A). FIG. 8 is a flowchart of an example method 800 of calibrating a memory device. Method 800 may be arranged in accordance with at least one embodiment described in the present disclosure. Method 800 may be performed, in some embodiments, by a device or system, such as memory system 100 of FIG. 1, one or more memory devices of memory system 100, memory device 200 of FIG. 2, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

Method 800 may begin at block 802, wherein, based on a calibration code, at least one unit driver of an output driver of a semiconductor device of a system may be configured, and method 800 may proceed to block 804. For example, the at least one unit driver (e.g., unit driver 608 of output driver 602 of FIG. 6) may be configured (i.e., based on the calibration code) such that one or more transistors (e.g., transistors M of FIG. 6) are conducting (i.e., turned ON). Further, for example, the calibration code may be sent from a host (e.g., host 604 of FIG. 6) to the output driver (e.g., output driver 602 of FIG. 6).

At block 804, a signal may be transmitted from the semiconductor device to a host of the system, and method 800 may proceed to block 806. For example, with reference to FIG. 6, read data may be transmitted from node N to host 604 via channel 606.

At block 806, a channel performance response associated with the transmitted signal may be compared to a previous channel performance response, and method 800 may proceed to block 808. For example, a channel performance response associated with a unit driver configuration (e.g., having two (2) transistors conducting) may be compared to a previous channel performance response associated with another unit driver configuration (e.g., having one (1) transistor conducting). For example, the host (e.g., host 604 of FIG. 6) may measure and compare the channel performance response with the previous channel performance response.

At block 808, in response to the channel performance response being improved relative to the previous channel performance response, the calibration code may be stored. For example, the calibration code may be stored in a register (e.g., register 616 of FIG. 6) of the memory device. For example, in response to the channel performance response being improved relative to the previous channel performance response, the host (e.g., host 604 of FIG. 6) may convey a signal to the output driver (e.g., output driver 602 of FIG. 6) instructing the output driver to store the calibration code (e.g., in register 616 of FIG. 6).

As will be appreciated, various operations of method 800 may be repeated such that the unit driver may be configured in a number of configurations (i.e., based on a number of calibration codes), and channel performance responses for each of the number of configuration may be analyzed and/or compared to other channel responses to identify an optimal channel response and associated calibration code for the unit driver.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, method 800 may include receiving, at the memory device, a calibration code from an external host (e.g., host 604 of FIG. 6) prior to configuring the at least one unit driver of the semiconductor device.

A memory system is also disclosed. The memory system may include a number of memory devices. Each memory device may include one or more arrays (e.g., memory arrays) and one or more output drivers, as described herein.

Figure 9:
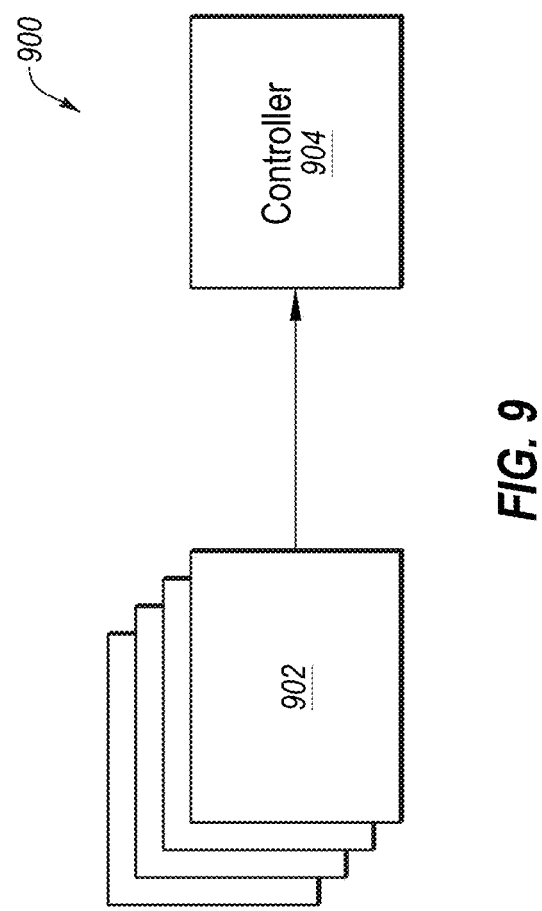
FIG. 9 is a simplified block diagram of an example memory system implemented according to one or more embodiments described herein.

FIG. 9 is a simplified block diagram of a memory system 900 implemented according to one or more embodiments described herein. Memory system 900 includes a number of memory devices 902 and a controller 904. For example, one or more of memory devices 902 may include an output driver 602 of FIG. 6, and controller 904 may be and/or include controller 112 of FIG. 1 and/or host 604 of FIG. 6. Each memory device 902, which may include one or more memory cells, may include one or more output driver circuits including one or more unit drivers, as described herein.

Figure 10:
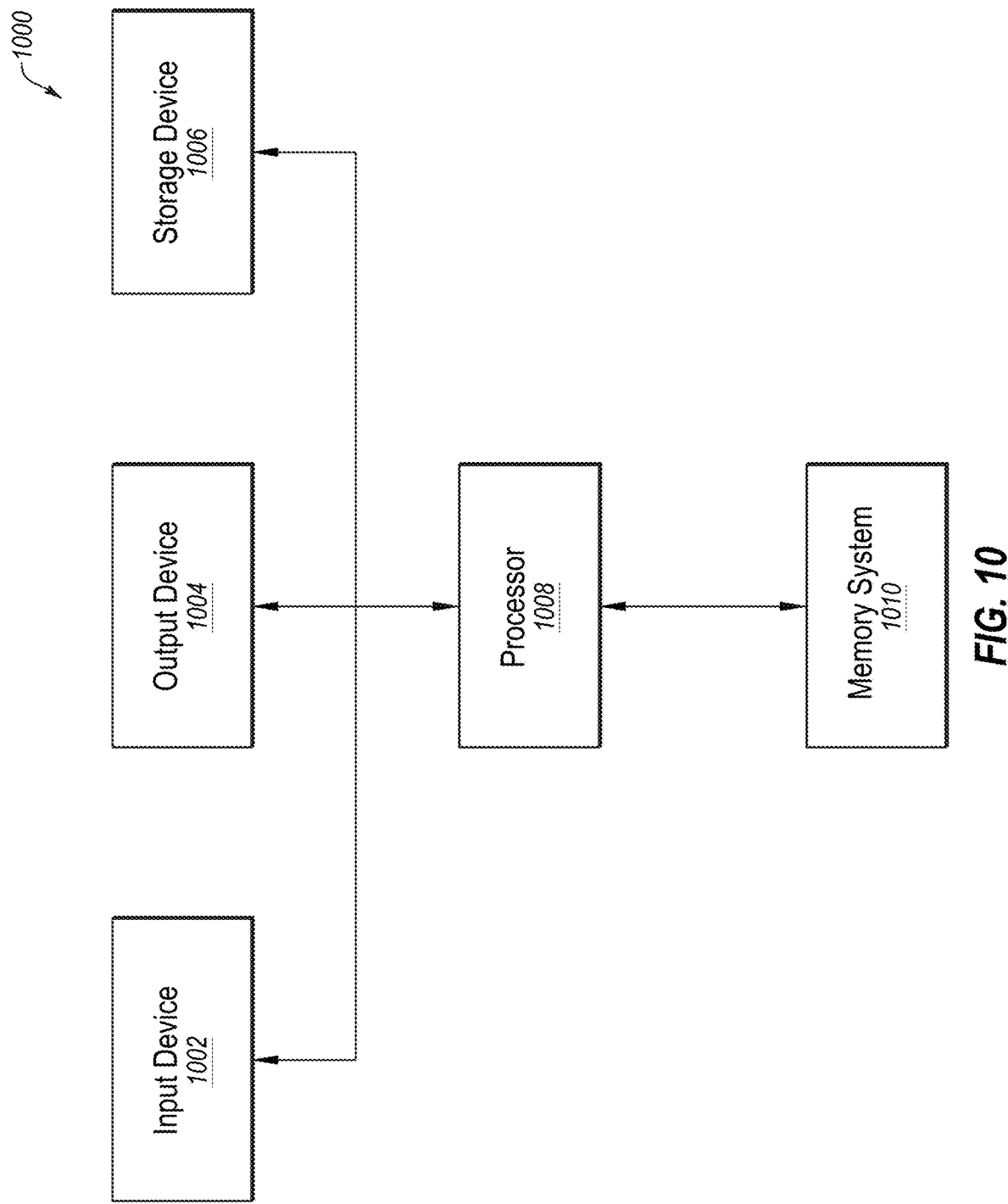
FIG. 10 is a simplified block diagram of an example electronic system implemented according to one or more embodiments described herein.

An electronic system is also disclosed. The electronic system may include a memory system including a number of memory devices. FIG. 10 is a simplified block diagram of an electronic system 1000 implemented according to one or more embodiments described herein. Electronic system 1000 includes at least one input device 1002. Input device 1002 may be a keyboard, a mouse, or a touch screen. Electronic system 1000 further includes at least one output device 1004. Output device 1004 may be a monitor, touch screen, or speaker. Input device 1002 and output device 1004 are not necessarily separable from one another. Electronic system 1000 further includes a storage device 1006. Input device 1002, output device 1004, and storage device 1006 are coupled to a processor 1008.

Electronic system 1000 further includes a memory system 1010 coupled to processor 1008. Memory system 1010, which may include memory system 900 of FIG. 9, includes a number of memory devices (e.g., memory device 102-105 of FIG. 1). Electronic system 1000 may include a computing, processing, industrial, or consumer product. For example, without limitation, electronic system 1000 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

According to various embodiments disclosed herein, and in contrast to some conventional methods, systems, and devices, a memory system tune an output impedance of one or more unit drivers without requiring manual adjustment of the output impedance. As will be appreciated, the devices, systems, and methods disclosed herein may reduce an amount of time and/or resources that may be needed to calibrate an output impedance of one or more semiconductor devices of a system. Further, as noted above, various embodiments may allow for an output resistance Ron to be adjusted to any suitable value, even a value outside of a design specification range. Moreover, according to some embodiments, a desired calibration code (e.g., indicative of a desired value of output resistance Ron) may be stored at a memory device, and thus a load of an associated host (e.g., host 604) may not be increased.

One or more embodiments of the present disclosure include a device. The device may include an output driver including a number of unit drivers. Each unit driver of the number of unit drivers may include a number of transistors coupled to an output node. The output driver may also include circuitry coupled to the number of unit drivers. The circuitry may be adapted to configure at least one unit driver of the number of unit drivers in each of a number of configurations. Each configuration of the number of configurations may be associated with a calibration code of a number of calibration codes and each configuration generates, in response to signal transmission via the output node, an associated channel performance response of a number of channel performance responses. The circuitry may also be adapted to store, in response to receipt of a signal, a selected calibration code for the at least one unit driver, wherein the selected calibration code generates a desired channel performance response of the number of channel performance responses.

Some embodiments of the present disclosure include a system. The system may include a semiconductor device including at least one driver including a number of transistors. The semiconductor device may also include circuitry coupled to the at least one driver and adapted to configure the at least one driver in a number of configurations, wherein each configuration includes a unique number of activated transistors of the number of transistors. The system may also include a host coupled to the semiconductor device. The host may be configured to convey a number of signals to the driver to configure the driver in each configuration of the number of configurations. The host may also be configured to evaluate a signal integrity response for each configuration of the number of configurations to select a configuration of the number of configurations. Further, the host may be configured to convey a signal to the semiconductor device to store a calibration code associated with the selected configuration.

Additional embodiments of the present disclosure include an electronic system. The electronic system may include at least one input device, at least one output device, at least one processor device operably coupled to the input device and the output device; and at least one memory system operably coupled to the at least one processor device. The memory system may include a memory device including a driver including a number of transistors coupled to an output node. The memory device may also include circuitry coupled to the driver and adapted to configure the driver in each of a number of configurations, wherein each configuration includes a unique number of activated transistors of the number of transistors. The circuitry may further be adapted to store, in response to receipt of a signal, a calibration code for the driver, wherein the calibration code generates a desired channel performance response for the driver.

Other embodiments of the present disclosure include a method. The method may include configuring, based on a calibration code, at least one unit driver of an output driver of a semiconductor device. Further, the method may include transmitting a signal from the semiconductor device. The method may also include comparing a channel performance response associated with the transmitted signal to a previous channel performance response. Moreover, the method may include storing the calibration code in response to the channel performance response being improved relative to the previous channel performance response.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
  a number of unit drivers; and
  circuitry adapted to:
    receive a number of calibration codes from an external host;

configure at least one unit driver of the number of unit drivers in each of a number of configurations, wherein each configuration of the number of configurations is associated with a calibration code of the number of calibration codes; and receive, in response to a signal from the external host, a selected calibration code for the at least one unit driver, wherein the selected calibration code generates a desired channel performance response.

2. The device of claim 1, wherein the circuitry comprises a register configured to store the selected calibration code in response to the signal.

3. The device of claim 2, wherein the register is configured to couple to and receive the signal from the external host.

4. The device of claim 2, wherein the circuitry further comprises a multiplexer having a first input coupled to an output of the register and configured to convey the calibration code to one or more unit drivers of the number of unit drivers.

5. The device of claim 4, wherein the circuitry further comprises:
logic configured for coupling to the external host; and
a second register having an input coupled to an output of the logic and an output coupled to a second input of the multiplexer.

6. The device of claim 1, wherein each configuration of the number of configurations includes a unique number of conducting transistors coupled to an output node of an associated unit driver of the number of unit drivers.

7. A system, comprising:
a semiconductor device including a driver adapted to be configured in a number of different configurations; and
a host configured to:
convey a calibration code to the semiconductor device;
evaluate a signal integrity response for each configuration of the number of different configurations to select a configuration of the number of different configurations; and
convey a signal to the semiconductor device to store the calibration code associated with the selected configuration.

8. The system of claim 7, further comprising a first register configured to store the calibration code associated with the selected configuration of the number of different configurations.

9. The system of claim 8, further comprising:
logic coupled to the host;
a second register having an input coupled to an output of the logic; and
a multiplexer having a first input coupled to an output of the first register and a second input coupled to an output of the second register, the multiplexer configured to convey a signal to at least one driver to configure the at least one driver in a configuration of the number of configurations.

10. The system of claim 7, wherein the host is configured to compare signal integrity responses for two or more of the number of configurations to select the configuration of the number of configurations.

11. The system of claim 7, wherein each configuration of the number of configurations includes a unique number of transistors in a conductive state.

12. The system of claim 7, wherein the host is configured to compare a current signal integrity response with a previous signal integrity response to determine if the current signal integrity response is improved relative to the previous signal integrity response.

13. A system, comprising:
a memory device including:
a driver including a number of transistors coupled to an output node; and
circuitry coupled to the driver and adapted to:
receive a calibration code from an external host; and
store, in response to receipt of a signal from the external host, the calibration code for the driver, wherein the calibration code is associated with a desired channel performance response for the driver.

14. The system of claim 13, wherein the memory device is configured to convey a number of signals via an output node, wherein each signal of the number of signals is associated with a configuration of the number of configurations.

15. The system of claim 14, further comprising the external host coupled to the memory device and configured to:
receive the number of signals from the memory device;
determine, based on the received number of signals, an optimal configuration of the number of configurations, the optimal configuration associated with the desired channel performance response; and
convey, in response to determining the optimal configuration, the signal to the memory device.

16. A method, comprising:
conveying a calibration code to a semiconductor device from a host external to the semiconductor device;
comparing, via the host, a channel performance response of the semiconductor device to a previous channel performance response of the semiconductor device; and
storing the calibration code in response to the channel performance response being improved relative to the previous channel performance response.

17. The method of claim 16, wherein comparing a channel performance response of a semiconductor device comprises comparing the channel performance response associated with a signal transmitted from the semiconductor device.

18. The method of claim 16, further comprising receiving, at the semiconductor device, a signal indicating that the channel performance response is improved relative to the previous channel performance response.

19. The method of claim 16, configuring, based on the received calibration code, the semiconductor device.

* * * * *

UNITED STATES PATENT AND TRADEMARK OFFICE
CERTIFICATE OF CORRECTION

PATENT NO. : 11,960,906 B2
APPLICATION NO. : 18/048588
DATED : April 16, 2024
INVENTOR(S) : Hyunui Lee Page 1 of 1

It is certified that error appears in the above-identified patent and that said Letters Patent is hereby corrected as shown below:

In the Specification

| | | |
|---|---|---|
| Column 3, | Line 47, | change "lines BL and/BL)," to --lines BL and /BL),-- |
| Column 3, | Line 49, | change "BL and/BL. The" to --BL and /BL. The-- |
| Column 3, | Line 51, | change "BL and/BL may" to --BL and /BL may-- |
| Column 3, | Line 57, | change "BL and/BL are" to --BL and /BL are-- |
| Column 3, | Line 58, | change "line BL or/BL may" to --line BL or /BL may-- |
| Column 3, | Line 67, | change "line BL or/BL." to --line BL or /BL.-- |
| Column 4, | Line 51, | change "CK and/CK may" to --CK and /CK may-- |
| Column 4, | Line 54, | change "and/CK. Internal" to --and /CK. Internal-- |

Signed and Sealed this
Ninth Day of July, 2024

*Katherine Kelly Vidal*

Katherine Kelly Vidal
*Director of the United States Patent and Trademark Office*